United States Patent
Reimers

(10) Patent No.: US 6,320,123 B1
(45) Date of Patent: Nov. 20, 2001

(54) SYSTEM AND METHOD FOR SHIELDING ELECTRICAL COMPONENTS FROM ELECTROMAGNETIC WAVES

(76) Inventor: Steven S. Reimers, P.O. Box 232, 210 S. Hanover St., Schaller, IA (US) 51053

( * ) Notice: Subject to any disclaimer, the term of this patent is extended or adjusted under 35 U.S.C. 154(b) by 0 days.

(21) Appl. No.: 09/421,212

(22) Filed: Oct. 20, 1999

(51) Int. Cl.[7] .................................................. H05K 9/00
(52) U.S. Cl. ........................ 174/35 MS; 174/35 R; 174/816
(58) Field of Search ................... 174/35 R, 35 MS, 174/35 GC, 51, 2, 5 SE, 6; 361/799, 800, 753, 816, 818

(56) References Cited

U.S. PATENT DOCUMENTS

| | | |
|---|---|---|
| 2,831,912 | 4/1958 | Williams ................................ 174/35 |
| 2,858,451 | 10/1958 | Silversher ............................ 250/108 |
| 2,961,478 | 11/1960 | Burns ...................................... 174/35 |
| 3,153,692 | 10/1964 | Lindgren ................................ 174/35 |
| 3,231,451 | 1/1966 | Gazelle ................................... 161/43 |
| 3,333,220 | 7/1967 | Fischer et al. .......................... 336/84 |
| 3,982,058 | 9/1976 | Hill ......................................... 174/2 |
| 4,189,618 | 2/1980 | Bretts et al. ..................... 174/35 MS |
| 4,794,206 * | 12/1988 | Weinstein ........................ 174/35 MS |
| 4,806,703 * | 2/1989 | Sims ................................ 174/35 MS |
| 4,959,504 * | 9/1990 | Yarger et al. .................... 174/35 MS |
| 4,965,408 * | 10/1990 | Chapman et al. .............. 174/35 MS |
| 5,043,529 * | 8/1991 | Vanesky et al. ................ 174/35 MS |
| 5,063,273 * | 11/1991 | Bloks .................................. 174/35 R |
| 5,171,936 * | 12/1992 | Suzuki et al. ................... 174/35 MS |
| 5,749,178 | 5/1998 | Garmong ............................... 52/79.1 |
| 5,827,998 | 10/1998 | Moriguchi ...................... 174/35 MS |
| 5,847,316 | 12/1998 | Takada ............................ 174/35 MS |
| 5,902,956 | 5/1999 | Spies et al. ..................... 174/35 GC |
| 5,907,471 | 5/1999 | Patel et al. ........................... 361/500 |
| 6,068,009 * | 5/2000 | Paes et al. ............................ 135/117 |

FOREIGN PATENT DOCUMENTS 0 272 234 * 6/1988 (EP) .
2 234 636 * 2/1991 (GB) .

* cited by examiner

Primary Examiner—Dean A. Reichard
Assistant Examiner—Carmelo Oliva
(74) Attorney, Agent, or Firm—Zarley, McKee, Thomte, Voorhees & Sease

(57) ABSTRACT

A method and system for shielding electrical components from electromagnetic waves is provided. The enclosure is lined with layers of lead and copper. These layers are electrically connected to wires that route electricity generated by an electromagnetic wave to a halo of wire on the ceiling. The halo is connected to one or more ground windows which in turn are connected to a wire that runs the current into a ground so as to provide maximum protection to the electrical components by shielding them from the electromagnetic wave and any current generated thereby.

19 Claims, 2 Drawing Sheets

SYSTEM AND METHOD FOR SHIELDING ELECTRICAL COMPONENTS FROM ELECTROMAGNETIC WAVES

BACKGROUND OF THE INVENTION

1. Field of the Invention

The present invention relates to shielding electronic equipment from electromagnetic waves or pulses and more specifically to a system and method of routing the electromagnetic waves up to a halo and out to the ground.

2. Problems in the Art

Electronic and solid state components are extremely sensitive to changes of magnetic and electric fields caused by both natural and man-made phenomenon. Solar flares, electrical lines, and lightning are some of the many natural and man-made causes of increased electromagnetic wave activity. Telecommunications equipment is particularly susceptible to such phenomena. Currently such telecommunications equipment is protected by using isolated grounds.

These grounding stations have not been able to protect electrical equipment from high intensity electromagnetic waves. As an electromagnetic wave penetrates a surface, it induces an electric current through that surface. It is this electric current that can harm sensitive equipment. It is therefore desirable to have a method and system of shielding electrical equipment from high intensity electromagnetic waves that routes the electric current generated from high intensity electromagnetic waves out to ground.

Others have tried to shield individual electrical components, such as computer equipment, through various means. For example, U.S. Pat. No. 3,982,058 to Hill uses three layers of various materials which attempt to prevent major penetration of electromagnetic waves. Because such materials can be relatively expensive, the use of individual enclosures can be cost prohibitive. Further, nothing is done to route the electric current created by these waves. Thus a shielding device such as this can reach saturation magnetization because of high-flux density magnetic fields, thereby reducing the effectiveness of the shield. It is therefore desirable to provide a low cost means of shielding electrical equipment from high intensity electromagnetic waves.

FEATURES OF THE INVENTION

A general feature of the present invention is the provision of a method and system for shielding electrical components from electromagnetic waves.

A further feature of the present invention is the provision of a method and system for shielding electrical equipment from the current induced by such waves.

Another feature of the present invention is the provision of method and system for shielding electrical equipment from high-intensity electromagnetic waves which is relatively low in cost.

A still further feature of the present invention is the provision of a ground window to which the ground wire of various electrical componentry is attached.

These, as well as other features and advantages of the present invention, will become apparent from the following specification and claims.

SUMMARY OF THE INVENTION

The present invention generally comprises a method and system for shielding electrical components from electromagnetic waves and the effects therefrom. Electrical components are generally housed in a plurality of walls formed so as to form an enclosure common in the art. These walls are lined with an initial layer of lead which is attached to a layer of copper. These layers are electrically connected to a plurality of #4 copper wire sets that run vertically up the walls to a halo. This halo is composed of copper wire and is above the electrical components on the ceiling of the enclosure.

When an electromagnetic wave strikes the surface of the enclosure, the layer of lead absorbs the greater intensity waves and routes any electrical current generated thereby up the plurality of wire sets to the halo. The remaining intensity electromagnetic waves strike the layer of copper and generate an electrical current. This current is also routed up the plurality of wire sets to the halo.

The halo is electrically connected to a first grounding window which is in turn electrically connected to a wire running to a ground. The first grounding window routes the collected current from the halo out of the halo and down the wire to the ground, thereby preventing the current from affecting the electrical components housed in the enclosure.

DETAILED DESCRIPTION OF THE PREFERRED EMBODIMENT(S)

The present invention will be described as it applies to its preferred embodiment. It is not intended that the present invention be limited to the described embodiment. It is intended that the invention cover all modifications and alternatives which may be included within the spirit and scope of the invention.

Figure 1:
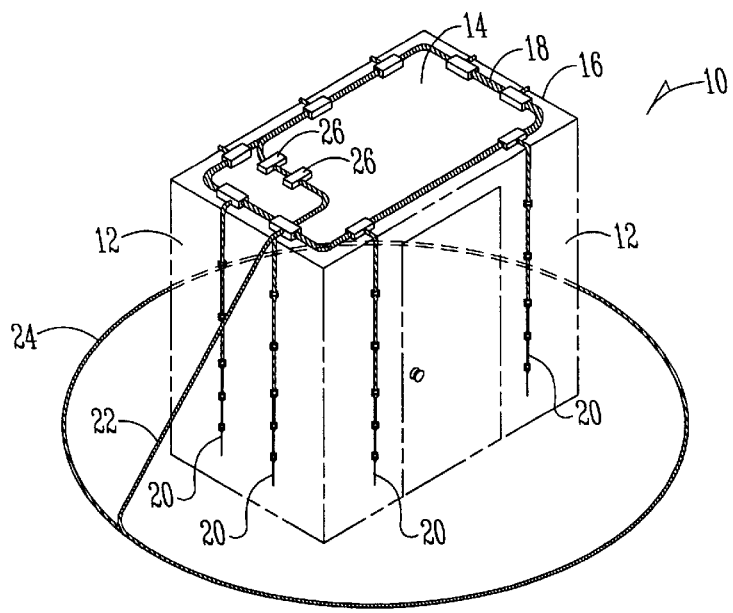
FIG. 1 is a perspective view of the electromagnetic wave shielding system.

Now referring to the drawings, FIG. 1 shows the electromagnetic wave shielding system 10. In the preferred embodiment, four walls 12 and a ceiling 14 are connected to form a standard box shaped shed 16. On top of the shed 16 is a halo 18 of wire. The halo 18 is composed of standard No. #1/0 copper wire. When an electromagnetic wave hits the surface of one of the walls 12, an electric current is generated. This electric current is then gathered via a plurality of wire sets 20 which run vertically along the walls 12 and to ceiling 14. Each wire set 20 runs parallel to the next wire set 20. Although not shown in the drawings, the similar arrangement of contacts every four feet (beginning two feet from the walls 12) may be found in the ceiling 14.

Alternatively, through the process of bonding the materials to the housing, the shed 18 is a cabinet designed to enclose a specific piece of equipment, or any other type of enclosure such as a room where sensitive equipment is kept, a stereo cabinet, a software storage box, or a casing surrounding computer componentry such as is currently found with most personal computers. Similar structure can be used to protect car ignition systems using the frame of the automobile as a grounding field. The ceiling 14 portion of such alternatives would necessarily be the upper most portion of the enclosure, although any side of the enclosure may be used.

Initially, when the electromagnetic wave shielding system 10 is constructed, the first wire set 20 is placed two feet from the edge of the first wall 12. Thereafter, each wire set 20 is placed apart from the previous wire set 20 at a horizontal distance of four feet. None of the wire sets contact the bottom of the shed 16. Preferably, the wire sets 20 begin two feet from the bottom of the shed 16 so as to prevent an electrical connection between the wire sets 20 and the ground.

Figure 2:
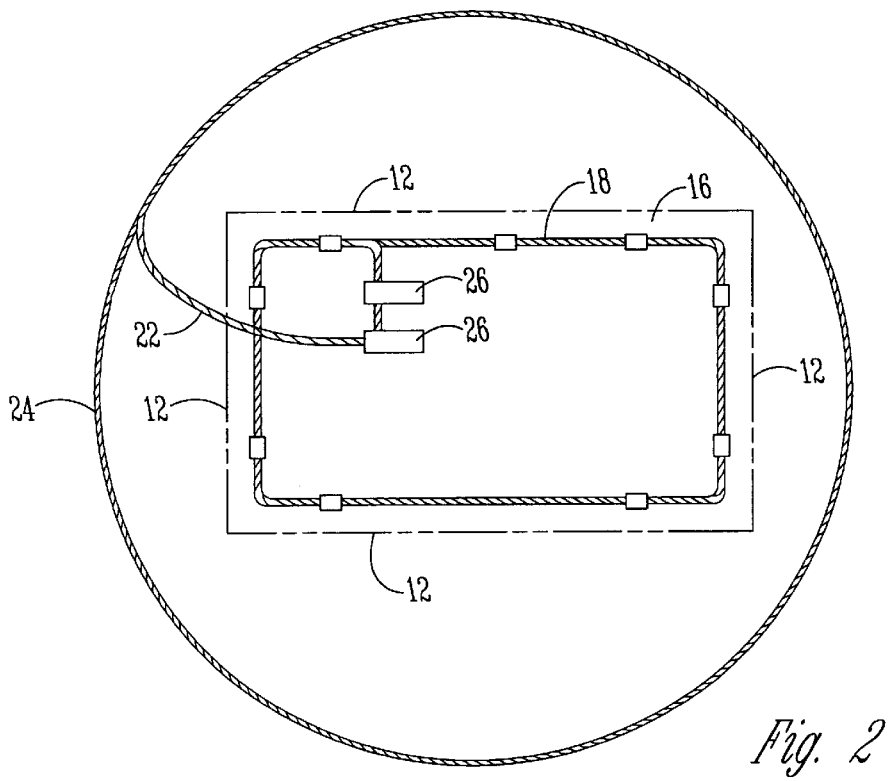
FIG. 2 is a top view of the electromagnetic wave shielding system.

As is shown in FIG. 2, generally, the electric current gathered in the wire sets 20 runs up the wire sets 20 to the halo 18. The halo 18 gathers all of the electric current collected by the wire sets 20 and routes it out the ground wire 22. The ground wire 22 then transfers the electric current to the earth. Preferably, the ground wire 22 runs into an earth-buried wire 24. The wire 24 encircles the shed 16 and is buried four feet in the earth transferring the electric current to a natural electrical ground.

The electromagnetic wave shielding system 10 includes two ground windows 26. The ground windows 26 are connected in series from the halo 18 to the ground wire 22. The ground windows 26 allow a user to attach ground wires from sensitive equipment stored in the shed 18. This provides a safe grounding point for the sensitive equipment.

Figure 4:
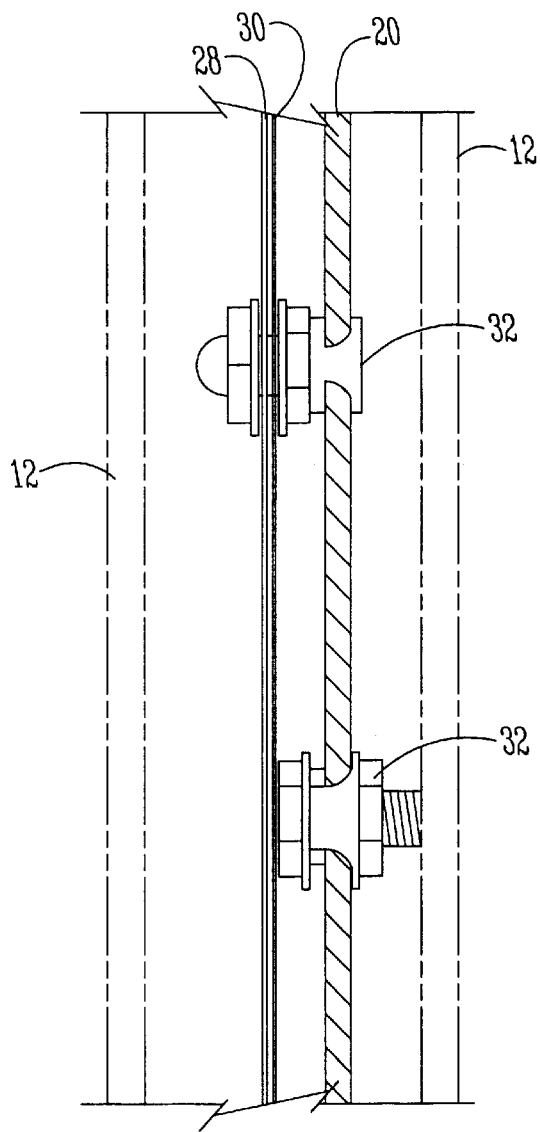
FIG. 4 is a sectional view of a wall in the electromagnetic wave shielding system.

As shown in FIG. 4, the walls 12 of the shed 18 are lined with a layer of lead 28 which is secured to a layer of copper 30. Multiple alternating layer may be utilized. More layers are preferable (as high as 12 sets), although those sets of layers have been found to be adequate. The layer of lead is approximately 2 mm in thickness and the layer of copper 30 is preferably a thin copper mesh. When an electromagnetic wave hits the layer of lead 28, the higher intesity waves are absorbed and dispersed in the layer of lead 28, inducing a current in the layer of lead 28. The surviving waves then strike the layer of copper 30 and induce an electric current. The layer of lead 28 and the layer of copper 30 are secured to one another so as to provide an electrical connection. This is done using a copper bolt 32 which has been dipped in an oxidant. This bolt 32 is also secured to and provides and electrical connection to the wire set 20 and secures the wire set 20 to the wall 12.

Figure 3:
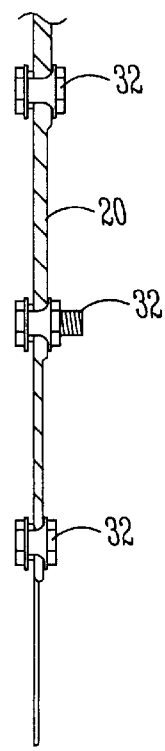
FIG. 3 is a sectional view of the plurality of wires running vertically along the walls in the electromagnetic wave shielding system.

As shown in FIG. 3, when the wire set 20 travels vertically up the wall 12, the amount of electric current the wire set must handle increases. A higher voltage requires a thicker wire and therefore, the number of wires in the wire set 20 increases as it progresses towards the top of the wall 12. At the top of the wall 12 the wire sets 20 join and are electrically connected to the halo 18.

A general description of the present invention as well as a preferred embodiment of the present invention has been set forth above. Those skilled in the art to which the present invention pertains will recognize and be able to practice additional variations in the methods and systems described which fall within the teachings of this invention. Accordingly, all such modifications and additions are deemed to be within the scope of the invention which is to be limited only by the claims appended hereto.

What is claimed is:

1. An electromagnetic wave shielding system for protecting electrical components comprising.

a plurality of walls including a ceiling surrounding said components;

a layer of lead secured to said walls and ceiling surrounding said components;

a layer of copper secured to said walls and ceiling surrounding said components;

a plurality of wire sets capable of conducting electricity and being electrically connected to the layer of lead and layer of copper and running vertically along said walls and ceiling;

a halo of wire on the top of the ceiling, said halo being electrically connected to the plurality of wire sets;

a first ground window electrically connected to said halo and on top of said ceiling;

a grounding wire capable of conducting electricity electrically connected to said first ground window and running from said first ground window to a natural ground.

2. The system of claim 1 wherein said layer of copper is attached to said layer of lead using a copper bolt dipped in an oxidant.

3. The system of claim 1 wherein the natural ground is comprising a discharge wire buried in the earth surrounding the plurality of walls.

4. The system of claim 1 wherein the plurality of wire sets running vertically along the walls and ceiling are spaced four feet apart from one another.

5. The system of claim 1 wherein each of the plurality of wire sets running vertically along the walls increases in thickness as it progresses upwards towards the halo.

6. The system of claim 1 wherein the electrical components are electrically connected to said first ground window.

7. The system of claim 1 further comprising:

a second ground window electrically connected to said first ground window.

8. The system of claim 7 wherein the electrical components are electrically connected to said second ground window.

9. A method for protecting electrical components from electromagnetic waves comprising:

surrounding said components with a plurality of walls having a top and a bottom ends and a ceiling secured to said top end of said walls;

fastening a layer of lead to said walls and ceiling; fastening a layer of copper to said walls and ceiling;

electrically connecting the layer of lead and the layer of copper to a plurality of wire sets capable of conducting electric current;

running said wire sets vertically along the walls to a halo of wire on top of the ceiling;

electrically connecting a first ground window to said halo; placing a wire in the earth circumscribing said walls; and electrically connecting said first ground window to the wire buried in the earth.

10. The method of claim 9 further comprising the step of:

electrically connecting said components to said first ground window.

11. The method of claim 9 further comprising the step of:

electrically connecting a second ground window to said first ground window.

12. The method of claim 11 further comprising the step of:

electrically connecting said components to said second ground window.

13. The method of claim 9 wherein the layer of lead and the layer of copper are connected using a copper bolt dipped in an oxidant.

14. The method of claim 9 wherein the wire sets increase in thickness as the wire sets get closer to the halo.

15. The method of claim 9 wherein the wire buried in the earth is buried at least four feet from the surface of the earth.

16. The method of claim 9 wherein the layer of lead, the layer of copper, and the plurality of wire sets do not run to the bottom end of said walls.

17. An electromagnetic wave shielding system for protecting electrical components comprising:

- an enclosure substantially surrounding the electrical components;
- a first layer of metal secured to the enclosure and surrounding the electrical components;
- an additional layer of metal secured to the first layer of metal and surrounding the electrical component;
- a wire set capable of conducting electricity and being electrically connected to the first layer of metal;
- a halo of wire electrically connected to the wire set; and
- a grounding wire capable of conducting electricity electrically connected to the wire set and running from the wire set to a natural ground.

18. The system of claim 17 wherein the first layer of metal is lead.

19. The system of claim 17 wherein the second layer of metal is copper.

* * * * *